US005777739A

United States Patent [19]
Sandhu et al.

[11] Patent Number: 5,777,739
[45] Date of Patent: Jul. 7, 1998

[54] ENDPOINT DETECTOR AND METHOD FOR MEASURING A CHANGE IN WAFER THICKNESS IN CHEMICAL-MECHANICAL POLISHING OF SEMICONDUCTOR WAFERS

[75] Inventors: Gurtej Singh Sandhu; Trung Tri Doan, both of Boise, Id.

[73] Assignee: Micron Technology, Inc., Boise, Id.

[21] Appl. No.: 602,617

[22] Filed: Feb. 16, 1996

[51] Int. Cl.$^6$ .................................. G01B 9/02
[52] U.S. Cl. ........................... 356/357; 356/358
[58] Field of Search ..................... 356/345, 357, 356/358

[56] References Cited

U.S. PATENT DOCUMENTS

| | | | |
|---|---|---|---|
| 4,200,395 | 4/1980 | Smith et al. | 356/356 |
| 4,203,799 | 5/1980 | Sugawara et al. | 156/601 |
| 4,358,338 | 11/1982 | Downey et al. | 156/627 |
| 4,367,044 | 1/1983 | Booth, Jr. et al. | 356/357 |
| 4,377,028 | 3/1983 | Imahashi | 29/574 |
| 4,422,764 | 12/1983 | Eastman | 356/357 |
| 4,640,002 | 2/1987 | Phillips et al. | 29/574 |
| 4,660,980 | 4/1987 | Takabayashi et al. | 356/357 |
| 4,717,255 | 1/1988 | Ulbers | 356/359 |
| 5,036,015 | 7/1991 | Sandhu et al. | 437/8 |
| 5,081,796 | 1/1992 | Schultz | 51/165.74 |
| 5,220,405 | 6/1993 | Barbee et al. | 356/357 |
| 5,324,381 | 6/1994 | Nishiguchi | 156/297 |
| 5,369,488 | 11/1994 | Morokuma | 356/358 |
| 5,413,941 | 5/1995 | Koos et al. | 437/8 |
| 5,433,651 | 7/1995 | Lustig et al. | 451/6 |
| 5,461,007 | 10/1995 | Kobayashi | 437/225 |
| 5,465,154 | 11/1995 | Levy | 356/357 |

*Primary Examiner*—Frank G. Font
*Assistant Examiner*—Robert Kim
*Attorney, Agent, or Firm*—Seed & Berry, LLP

[57] ABSTRACT

The present invention is an endpoint detector and a method for quickly and accurately measuring the change in thickness of a wafer in chemical-mechanical polishing processes. The endpoint detector has a reference platform, a measuring face, and a distance measuring device. The reference platform is positioned proximate to the wafer carrier, and the reference platform and measuring device are positioned apart from one another by a known, constant distance. The measuring face is fixedly positioned with respect to the wafer carrier at a location that allows the measuring device to engage the measuring face when the wafer is positioned on the reference platform. Each time the measuring device engages the measuring surface, it measures the displacement of the measuring face with respect to the measuring device. The displacement of the measuring face is proportional to the change in thickness of the wafer between measurements.

17 Claims, 6 Drawing Sheets

ENDPOINT DETECTOR AND METHOD FOR MEASURING A CHANGE IN WAFER THICKNESS IN CHEMICAL-MECHANICAL POLISHING OF SEMICONDUCTOR WAFERS

TECHNICAL FIELD

The present invention relates to an endpoint detector and a method for quickly and accurately measuring a change in thickness of a semiconductor wafer during chemical-mechanical polishing of the wafer.

BACKGROUND OF THE INVENTION

Chemical-mechanical polishing ("CMP") processes remove material from the surface of a wafer in the production of ultra-high density integrated circuits. In a typical CMP process, a wafer is pressed against a polishing pad in the presence of a slurry under controlled chemical, pressure, velocity, and temperature conditions. The slurry solution generally contains small, abrasive particles that abrade the surface of the wafer, and chemicals that etch and/or oxidize the surface of the wafer. The polishing pad is generally a planar pad made from a porous material such as blown polyurethane. Thus, when the pad and/or the wafer moves with respect to the other, material is removed from the surface of the wafer by the abrasive particles (mechanical removal) and by the chemicals in the slurry (chemical removal).

FIG. 1 schematically illustrates a conventional CMP machine 10 with a platen 20, a wafer carrier 30, a polishing pad 40, and a slurry 44 on the polishing pad. The platen 20 has a surface 22 upon which the polishing pad 40 is positioned. A drive assembly 26 rotates the platen 20 as indicated by arrow "A". In another type of existing CMP machine, the drive assembly 26 reciprocates the platen back and forth as indicated by arrow "B". The motion of the platen 20 is imparted to the pad 40 because the polishing pad 40 frictionally engages the surface 22 of the platen 20. The wafer carrier 30 has a lower surface 32 to which a wafer 60 may be attached, or the wafer 60 may be attached to a resilient pad 34 positioned between the wafer 60 and the lower surface 32. The wafer carrier 30 may be a weighted, free-floating wafer carrier, or an actuator assembly 36 may be attached to the wafer carrier 30 to impart axial and rotational motion, as indicated by arrows "C" and "D", respectively.

In the operation of the conventional polisher 10, the wafer 60 is positioned face-downward against the polishing pad 40, and then the platen 20 and the wafer carrier 30 move relative to one another. As the face of the wafer 60 moves across the planarizing surface 42 of the polishing pad 40, the polishing pad 40 and the slurry 44 remove material from the wafer 60.

In the competitive semiconductor industry, it is highly desirable to maximize the throughput of CMP processes to produce accurate, planar surfaces as quickly as possible. The throughput of CMP processes is a function of several factors, one of which is the ability to accurately stop the CMP process at a desired endpoint. Accurately stopping the CMP process at a desired endpoint is important to maintaining a high throughput because the thickness of the dielectric layer must be within an acceptable range; if the thickness of the dielectric layer is not within an acceptable range, the wafer must be re-polished until it reaches the desired endpoint. Re-polishing a wafer, however, significantly reduces the throughput of CMP processes. Thus, it is highly desirable to stop the CMP process at the desired endpoint.

In one conventional method for determining the endpoint of the CMP process, the polishing period of one wafer in a run is estimated using the polishing rate of previous wafers in the run. The estimated polishing period for the wafer, however, may not be accurate because the polishing rate may change from one wafer to another. Thus, this method may not accurately polish the wafer to the desired endpoint.

In another method for determining the endpoint of the CMP process, the wafer is removed from the pad and wafer carrier, and then the thickness of the wafer is measured. Removing the wafer from the pad and wafer carrier, however, is time-consuming and may damage the wafer. Moreover, if the wafer is not at the desired endpoint, then even more time is required to re-mount the wafer to the wafer carrier for repolishing. Thus, this method generally reduces the throughput of the CMP process.

In still another method for determining the endpoint of the CMP process, a portion of the wafer is moved beyond the edge of the pad, and an interferometer directs a beam of light directly onto the exposed portion of the wafer. The wafer, however, may not be in the same reference position each time it overhangs the pad because the edge of the pad is compressible, the wafer may pivot when it overhangs the pad, and the exposed portion of the wafer may vary from one measurement to the next. Thus, this method may inaccurately measure the change in thickness of the wafer.

In light of the problems with conventional endpoint detection techniques, it would be desirable to develop an apparatus and a method for quickly and accurately measuring the change in thickness of a wafer during the CMP process.

SUMMARY OF THE INVENTION

The inventive endpoint detector measures the change in thickness of a semiconductor wafer while the wafer is attached to a wafer carrier and during chemical-mechanical polishing of the wafer. The endpoint detector has a reference platform, a measuring face, and a distance measuring device. The reference platform is positioned proximate to the wafer carrier, and the reference platform and measuring device are positioned apart from one another by a known, constant distance for all of the measurements of a single wafer. The measuring face is fixedly positioned with respect to the wafer carrier at a location that allows the measuring device to engage the measuring face when the wafer is positioned on the reference platform. Each time the measuring device engages the measuring surface, it measures the displacement of the measuring face with respect to the measuring device. The displacement of the measuring face is proportional to the change in thickness of the wafer between measurements.

In an inventive method of the invention, the wafer is placed on the reference platform before it is polished, and then the measuring device engages the measuring surface to determine a baseline measurement of the position of the measuring face with respect to the measuring device. After the wafer is at least partially polished, the wafer is re-placed on the reference platform and the measuring device is re-engaged with the measuring face to determine a subsequent measurement of the position of the measuring face with respect to the measuring device. The displacement of the measuring face from the baseline measurement to the subsequent measurement is proportionate to the change in thickness of the wafer.

DETAILED DESCRIPTION OF THE INVENTION

The present invention is an endpoint detector that quickly and accurately measures a change in wafer thickness of a semiconductor wafer during chemical-mechanical polishing of the wafer. One important aspect of the invention is to provide a reference platform upon which the wafer is positioned each time a measurement is taken. Another important aspect of the invention is to provide a measuring face on the wafer carrier that may be engaged by a measuring device without removing the wafer from either the reference platform or the wafer carrier. As will be discussed in greater detail below, by providing such a reference platform and a measuring face, the change in wafer thickness can be quickly and accurately measured while the wafer is attached to the wafer carrier and positioned on the reference platform. As explained in detail below, FIGS. 2–6 illustrate endpoint detectors and CMP machines in accordance with the invention. Like reference numbers refer to like parts throughout the various figures.

Figure 1:
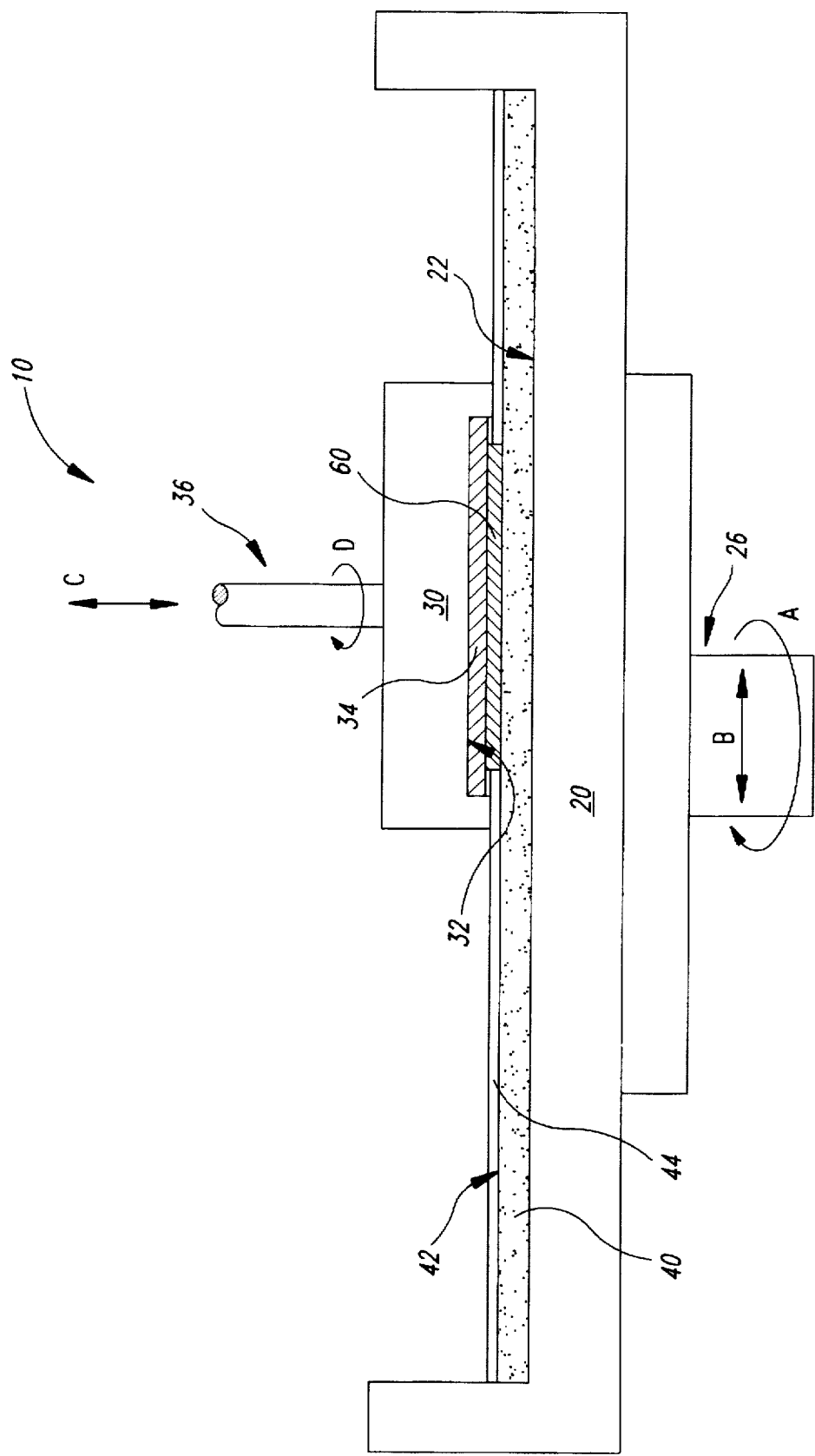
FIG. 1 is a schematic cross-sectional view of a conventional chemical-mechanical polishing machine in accordance with the prior art.
Figure 2:
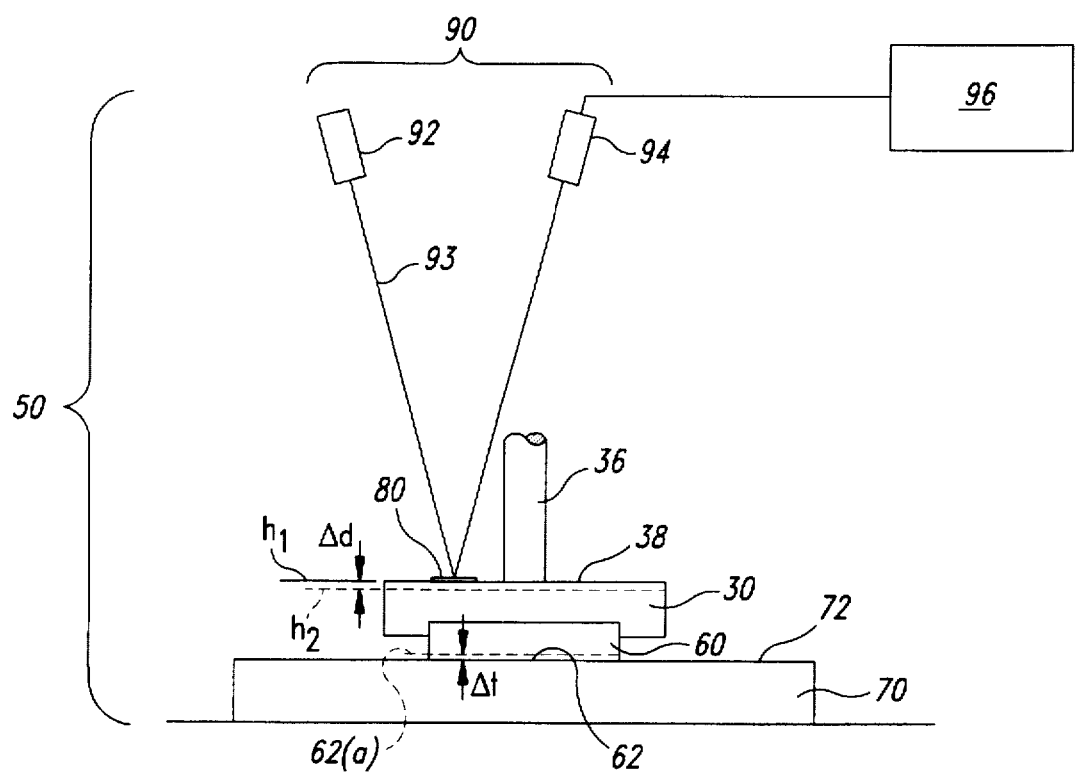
FIG. 2 is a schematic cross-sectional view of an endpoint detector in accordance with the invention.

FIG. 2 illustrates an endpoint detector 50 used in a conventional CMP machine in which a wafer 60 is mounted in a wafer carrier 30 attached to the end of an actuator assembly 36. The endpoint detector 50 includes a reference platform 70, a measuring face 80 on the wafer carrier 30, and a measuring device 90. An upper surface 72 on the reference platform 70 is maintained at a fixed distance from the measuring device 90 over all of the measurements of a single wafer. The measuring face 80 is positioned on an upper face 38 of the wafer carrier 30 so that it is exposed to the measuring device 90 when the wafer carrier 30 presses the wafer 60 against the reference surface 70. The measuring face 80 is preferably a planar, reflective surface that is either the upper surface 38 of the wafer carrier itself, or a separate panel attached to the wafer carrier 80. The measuring device 90 engages the measuring face 80 to measure the displacement of the measuring face 80 with respect to the fixed position of the measuring device 90.

In a preferred embodiment, the measuring device is an interferometer with an emitter 92 and a receiver 94. The emitter directs a beam of light onto the measuring face 80, which reflects the light beam back to the receiver 94. As the distance between the measuring face 80 and the measuring device 90 changes in correspondence to the change in thickness of the wafer 60, the phase of the reflected light beam at the receiver 94 changes accordingly. A controller 96 connected to the receiver 94 translates the phase change of the reflected light beam into a measurement of the vertical displacement of the measuring face 80 with respect to the position of the measuring device 90. Importantly, both the reference platform 70 and the measuring device 90 are fixed against displacement with respect to each other to maintain a constant distance therebetween over all of the measurements of a single wafer. The distance between the reference platform 70 and the measuring device 90, however, may change from one wafer to another. The endpoint detector 50, therefore, eliminates one variable of many conventional endpoint techniques that commonly produces inaccurate measurements of the change in thickness of the wafer 60.

In operation, the wafer carrier 30 initially places the wafer 60 on the upper surface 72 of the reference platform 70 before the wafer 60 is polished. When the wafer 60 is initially placed on the reference platform 70, the measuring face 80 is positioned at a height $h_1$ with respect to the measuring device 90. The emitter 92 then directs the light beam 93 onto the measuring face 80 to determine a baseline measurement of the position of the measuring face 80 at the height $h_1$. After the baseline measurement is obtained, the wafer is polished for a period of time. The change in thickness of the wafer ($\Delta t$) is equal to the distance between an original surface 62 of the wafer and a new surface 62(a). The wafer 60 is then re-placed on the upper surface 72 of the reference platform 70, and the position of the measuring face 80 accordingly changes to a height $h_2$. The light beam 93 from the measuring device 90 re-engages the measuring face 80 to measure the displacement ($\Delta d$) of the measuring face 80 at the height $h_2$. The displacement $\Delta d$ of the measuring face 80 is proportional to, and may directly correspond to, the change in thickness $\Delta t$ of the wafer 60.

One advantage of the endpoint detector 50 is that it provides highly accurate measurements of the change in thickness $\Delta t$ of the wafer 60. An important aspect of the invention is that the distance is constant between the upper surface 72 of the reference platform 70 and the measuring device 90 over all of the measurements of a single wafer. Accordingly, the displacement $\Delta d$ of the measuring surface 80 is caused by the change in thickness $\Delta t$ of the wafer 60. Moreover, by measuring the displacement of the measuring face 80, the wafer 60 does not need to overhang the reference platform 70 as in conventional techniques that directly impinge the wafer with a light beam. The endpoint detector 50, therefore, provides highly accurate measurements of the change in thickness $\Delta t$ of the wafer 60.

Figure 3:
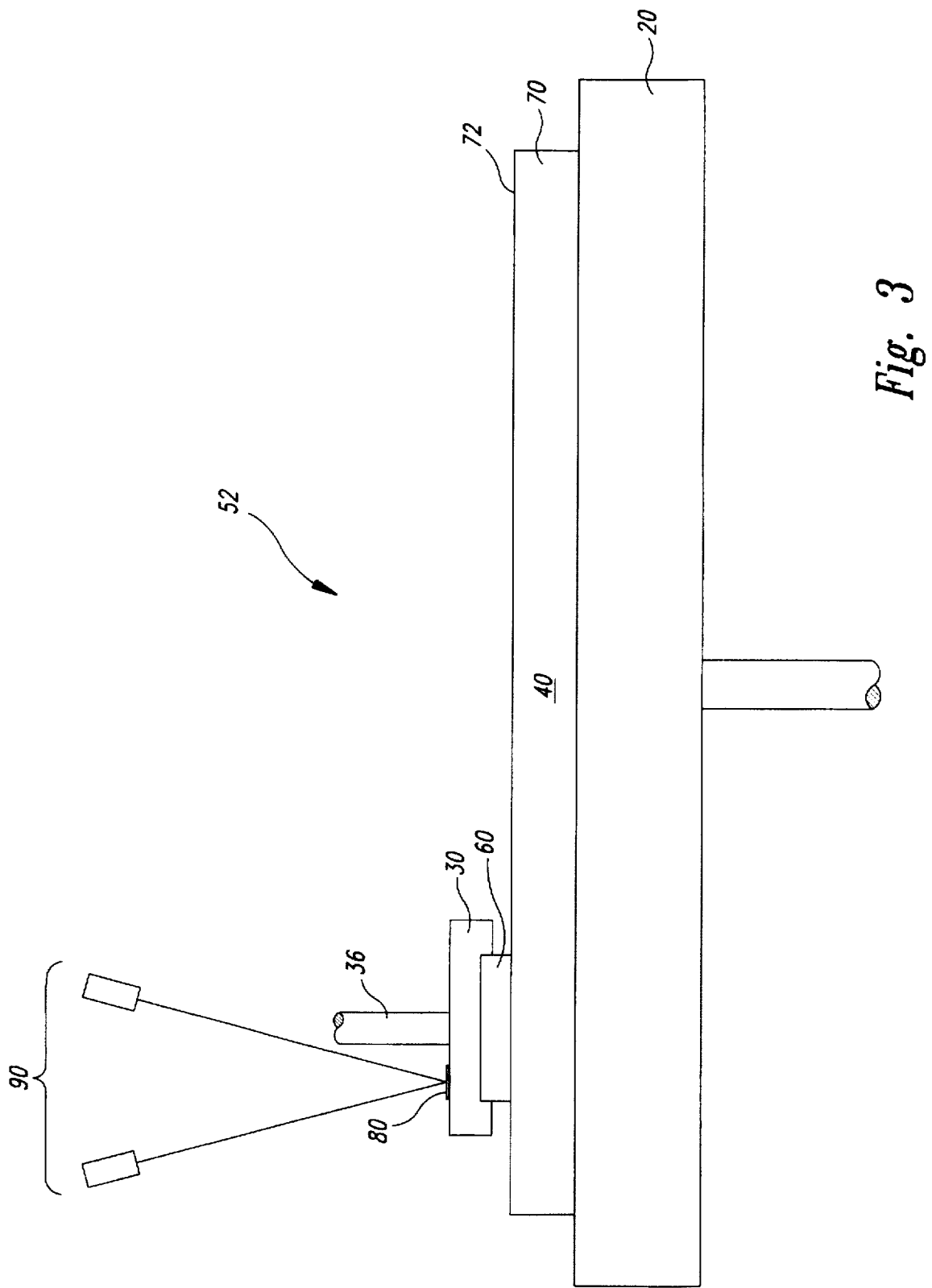
FIG. 3 is a schematic cross-sectional view of a polisher with an endpoint detector in accordance with the invention.

FIG. 3 schematically illustrates a polishing machine 52 with an endpoint detector in accordance with the invention. In this embodiment, the reference platform 70 is the polishing pad 40. The upper surface 72 of the platform 70 is accordingly the upper surface of the polishing pad 40. The wafer carrier 30 places the wafer 60 on the polishing pad/reference platform 70 to polish the wafer 60 and to measure the change in thickness of the wafer 60. When the wafer carrier 30 is positioned substantially under the measuring device, the measuring device 90 engages the measuring face 80. In operation, the change in thickness of the wafer is measured as described above with respect to FIG. 2. This embodiment of the invention is particularly useful for rigid pads or semi-rigid pads that compress substantially less than the change in thickness of the wafer. However, even if the polishing/pad reference platform 70 is compressible, the measurements made by the endpoint detector of the polishing machine 52 will be accurate as long as any force exerted on the pad/platform 70 is the same for all measurements. The polishing machine 52 quickly measures the change in thickness of the wafer 60 because the wafer 60 is not removed from either the wafer carrier 30 or the polishing pad/reference platform 70. Therefore, this particular embodiment of the invention enhances the throughput compared to conventional CMP processes.

Figure 4:
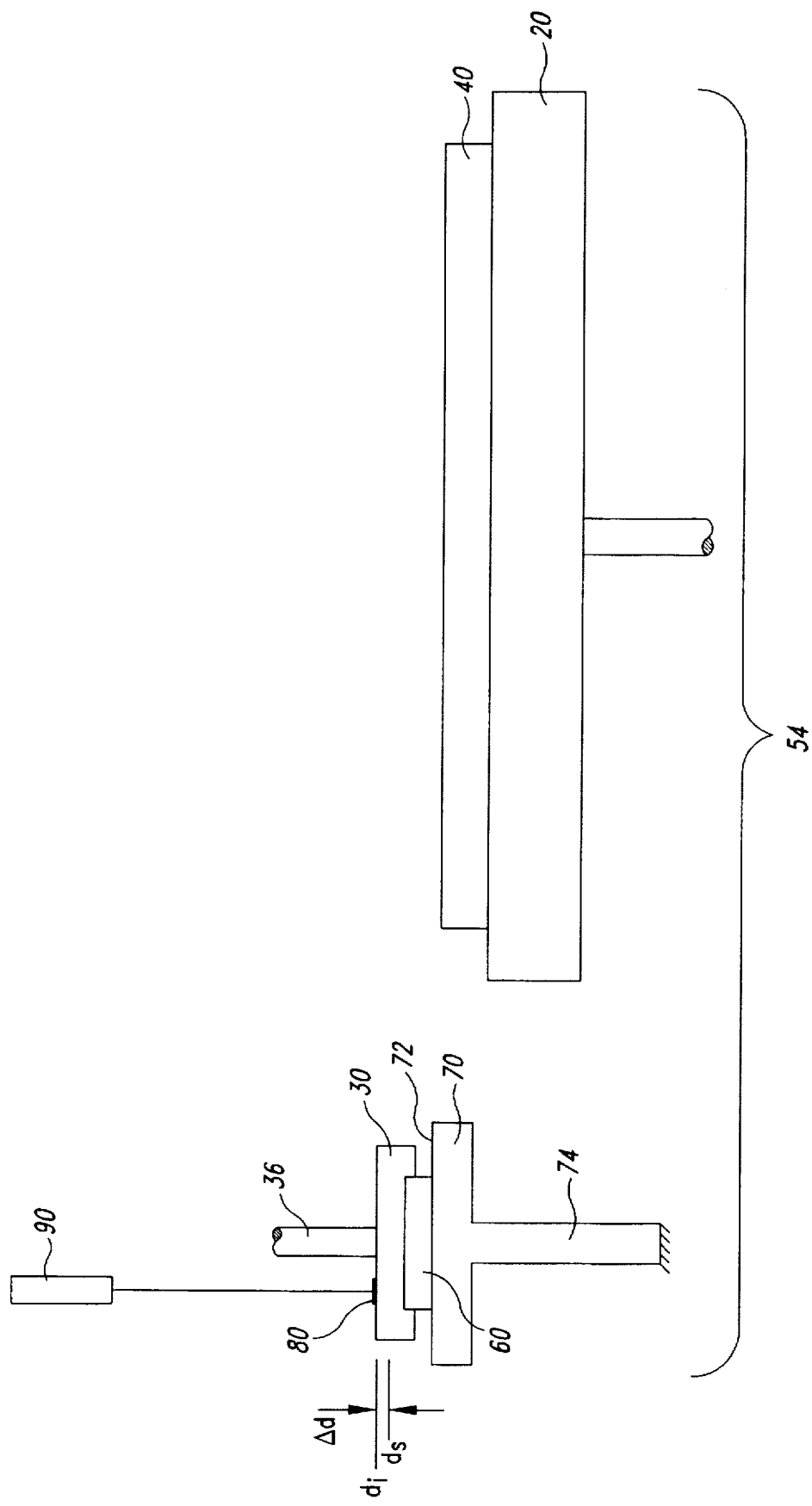
FIG. 4 is a schematic cross-sectional view of a polisher with an endpoint detector in accordance with the invention.
Figure 5:
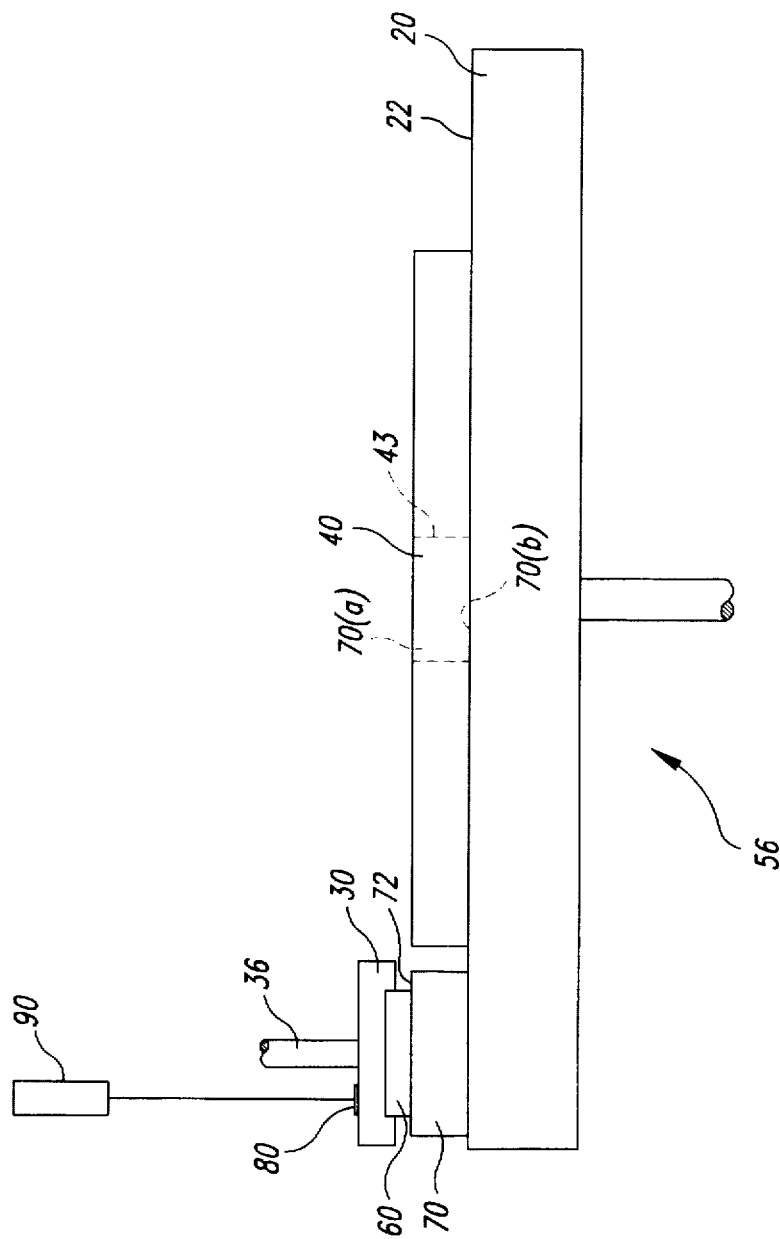
FIG. 5 is a schematic cross-sectional view of a polisher with an endpoint detector in accordance with the invention.
Figure 6:
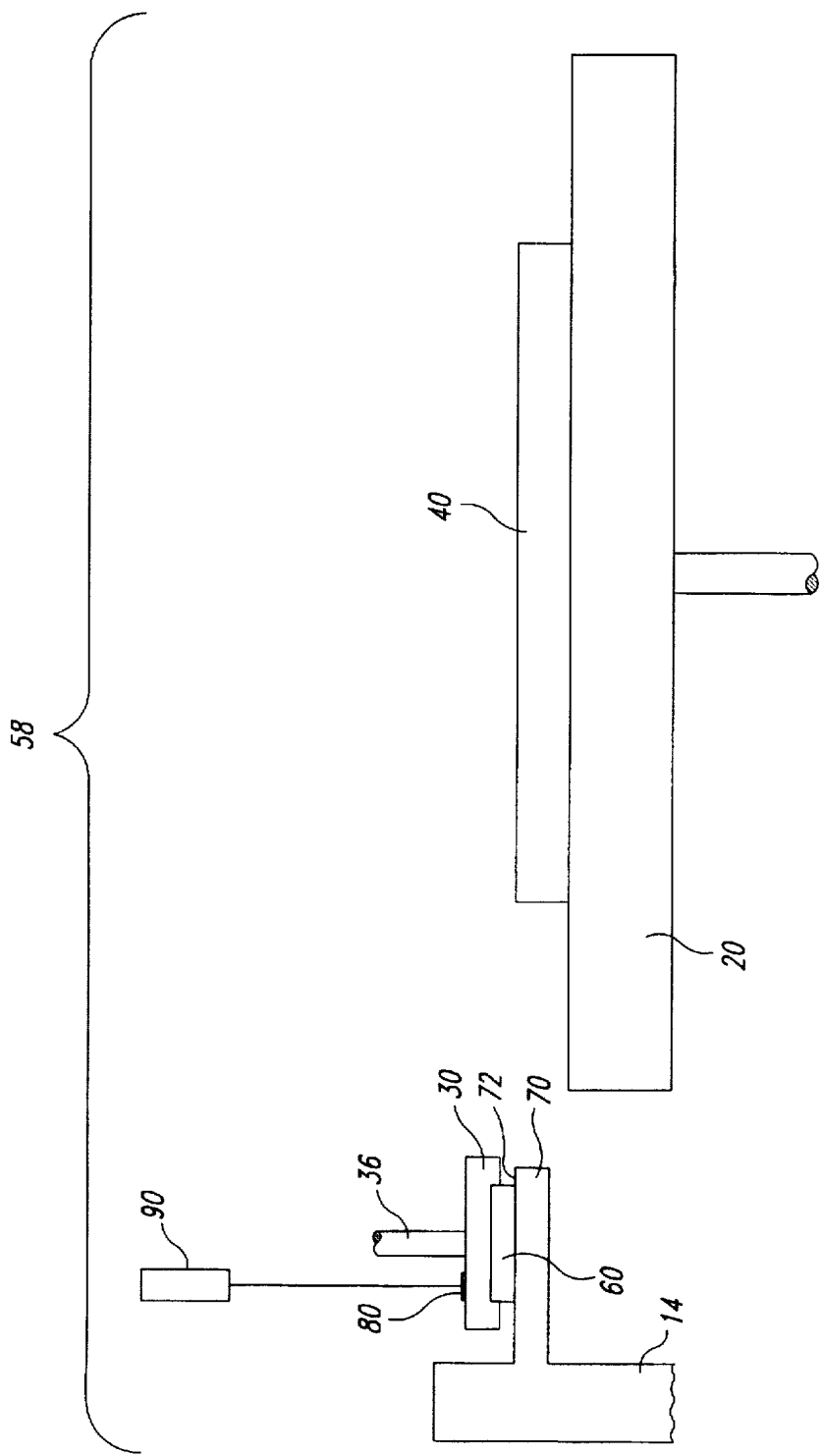
FIG. 6 is a schematic cross-sectional view of a polisher with an endpoint detector in accordance with the invention.

FIGS. 4–6 illustrate several embodiments of polishing machines with endpoint detectors. FIG. 4 shows a polishing machine 54 with an endpoint detector in which the reference platform 70 is a separate pedestal 74 that is fixed to the ground. FIG. 5 shows a polishing machine 56 with an endpoint detector in which the reference platform 70 is spaced radially outwardly away from the polishing pad 40 on the surface of the platen 20. In other related embodiments, a reference platform 70(a) may be positioned in a hole 43 at the center of the pad 40, or the hole 43 can provide access to a reference platform 70(b) defined by the center of the upper surface 22 of the platen 20. FIG. 6 shows a polishing machine 58 with an endpoint detector in which the reference platform 70 is attached to a wall 14 of the polishing machine. In each of the polishing machines 54, 56, and 58, the change in thickness of the wafer 60 is measured by moving the wafer 60 from the polishing pad 40 to the reference platform 70. The change in displacement of the measuring face 80 is measured by engaging the measuring face 80 with a light beam from the measuring device 90, as described above with respect to FIG. 2.

An advantage of the polishing machines 52, 54, 56, and 58 is that they generally enhance the throughput of the CMP process. When the reference platform 70 is the polishing pad, the change in thickness Δt of the wafer 60 may be measured without removing the wafer 60 from the wafer carrier 30 or the polishing pad. Accordingly, the change in thickness Δt of the wafer 60 may be measured in situ with only minimal interruption of the polishing of the wafer 60. When the platform 72 is separate from the polishing pad, the change in thickness Δt of the wafer 60 may be measured without removing the wafer 60 from the wafer carrier 30. Thus, the change in thickness Δt of the wafer may be measured with only a minor interruption to move the wafer between the polishing pad and the reference platform.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An endpoint detector for measuring a change in wafer thickness of a semiconductor wafer that is attached to a wafer carrier of a polishing machine during chemical-mechanical polishing of the wafer, comprising:

a reference platform positioned proximate to the wafer carrier, the wafer being engageable with the reference platform;

a measuring face fixedly positioned with respect to the wafer carrier; and a distance measuring device engageable with the measuring face when the wafer is engaged with the reference platform, wherein the measuring device and the reference platform are positioned apart from each other by a constant distance for all measurements of the wafer, and wherein the measuring device measures the displacement of the measuring face with respect to the measuring device.

2. The endpoint detector of claim 1 wherein the reference platform is a polishing pad mounted on a platen of the polishing machine.

3. The endpoint detector of claim 1 wherein the reference platform is a separate plate attached to a wall of the polishing machine.

4. The endpoint detector of claim 1 wherein the reference platform is a separate plate mounted on an upper surface of a platen of the polishing machine.

5. The endpoint detector of claim 1 wherein the reference platform is a separate plate mounted on a pedestal.

6. The endpoint detector of claim 1 wherein the measuring face is an upper face of the wafer carrier.

7. The endpoint detector of claim 1 wherein the measuring device is an interferometer that directs a beam onto the measuring surface.

8. A polishing machine for chemical-mechanical polishing of a semiconductor wafer, comprising:

a moveable platen;

a reference platform positioned proximate to the platen;

a wafer carrier for holding a wafer, the wafer carrier being positionable opposite the platen and the reference platform;

a measuring face fixedly positioned with respect to the wafer carrier; and a distance measuring device engageable with the measuring face when the wafer is engaged with the reference platform, wherein the measuring device and the reference platform are positioned apart from each other by a constant distance for all measurements of the wafer, and wherein the measuring device measures the displacement of the measuring face with respect to the measuring device.

9. The polishing machine of claim 8 wherein the platform is a separate plate attached to a wall of the polishing machine.

10. The polishing machine of claim 8 wherein the platform is a separate plate attached to an upper surface of the platen.

11. The polishing machine of claim 8 wherein the platform is a separate plate mounted on a pedestal.

12. The polishing machine of claim 8 wherein the platform is a polishing pad positioned on the platen.

13. The polishing machine of claim 8 wherein the measuring face is an upper face of the wafer carrier.

14. The polishing machine of claim 8 wherein the measuring device is an interferometer that directs a beam onto the measuring surface.

15. In chemical-mechanical polishing of semiconductor wafers, a method for measuring a change in thickness of a wafer that is attached to a wafer carrier of a polishing machine during polishing of the wafer, comprising the steps of:

placing the wafer on a reference platform;

engaging a measuring face on the wafer carrier with a measuring device as the wafer is placed on the reference platform to determine a baseline measurement of the position of the measuring face with respect to the measuring device;

re-placing the wafer on the reference platform after the wafer is at least partially polished; and re-engaging the measurement face with the measuring device as the wafer is re-placed against the reference platform to determine a subsequent measurement of the position of the measuring face with respect to the measuring device, wherein the change in thickness of the wafer proportionate to the difference between the baseline measurement and the subsequent measurement.

16. The method of claim 15 wherein the measuring device is an interferometer and the engaging and re-engaging steps comprise impinging a beam onto the measuring face and detecting a phase change in a reflection of the beam off of the measuring face.

17. The method of claim 15 wherein the placing and re-placing steps comprise exerting a constant force between the wafer and the platform for all measurements of the change in wafer thickness.

* * * * *